United States Patent [19]
Verhaverbeke

[11] Patent Number: 5,972,123
[45] Date of Patent: Oct. 26, 1999

[54] METHODS FOR TREATING SEMICONDUCTOR WAFERS

[75] Inventor: Steven Verhaverbeke, Radnor, Pa.

[73] Assignee: CFMT, Inc., Wilmington, Del.

[21] Appl. No.: 09/096,898

[22] Filed: Jun. 12, 1998

Related U.S. Application Data

[60] Provisional application No. 60/050,076, Jun. 13, 1997.

[51] Int. Cl.⁶ .............................. B08B 3/12; B08B 3/08
[52] U.S. Cl. .............................. 134/3; 134/1; 134/99.1; 438/750
[58] Field of Search ................... 134/3, 1, 99.1; 438/714, 749, 475

[56] References Cited

U.S. PATENT DOCUMENTS

| | | | |
|---|---|---|---|
| 3,650,960 | 3/1972 | Strauss et al. | 252/79.3 |
| 4,561,171 | 12/1985 | Schlosser | 438/58 |
| 4,633,893 | 1/1987 | McConnell et al. | 134/95.1 |
| 4,738,272 | 4/1988 | McConnell | 134/59 |
| 4,761,244 | 8/1988 | Scardera et al. | 252/79.3 |
| 4,795,497 | 1/1989 | McConnell et al. | 134/18 |
| 4,856,544 | 8/1989 | McConnell | 134/95.1 |
| 4,899,767 | 2/1990 | McConnell et al. | 134/56 R |
| 4,921,572 | 5/1990 | Roche | 156/653 |
| 5,101,457 | 3/1992 | Blonder et al. | 385/33 |
| 5,200,024 | 4/1993 | Blonder et al. | 156/628 |
| 5,393,694 | 2/1995 | Mathews | 437/72 |
| 5,448,672 | 9/1995 | Blonder et al. | 385/123 |
| 5,567,574 | 10/1996 | Hasemi et al. | 430/331 |
| 5,598,493 | 1/1997 | Bonham, Jr. et al. | 385/33 |
| 5,600,174 | 2/1997 | Reay et al. | 257/467 |
| 5,725,753 | 3/1998 | Harada et al. | 205/746 |
| 5,733,434 | 3/1998 | Harada et al. | 205/746 |
| 5,827,784 | 10/1998 | Loos | 438/750 |
| 5,858,106 | 1/1999 | Ohmi et al. | 134/1 |

OTHER PUBLICATIONS

Kern, W. "Overview and Evolution of Semiconductor Wafer Contamination and Cleaning Technology", Handbook of Semiconductor Wafer Cleaning Technology, Kern, W. (Ed.), Noyes Publication, Parkridge, NJ, 1993, Chapter 1, 3–67.

Burkman et al., "Wet Chemical Processes–Aqueous Cleaning Processs", Handbook of Semiconductor Wafer Cleaning Technology, Kern, W. (Ed.), Noyes Publication, Parkridge, NJ, 1993, Chapter 3, 111–151.

Horiki, H. et al., "Wet Etch Cleaning", Ultraclean Technology Handbook, Ohmi, T. (ed.). Marcel Dekker, Inc., vol. Ch. 3, 805–819.

Gise, P. et al., "Semiconductor and Integrated Circuit Fabrication Techniques", Reston Publishing Co., Reston, VA, 1979.

Kikuyama, H. et al., "Principles of Wet Chemical Processing in ULSI Microfabrication", *IEEE Trans. on Semic. Manuf.*, 1991, 4(1), 26–35.

Kern, W. et al., Chemical Etching, vol. 1, pp. 403–447, 452–453, 455–481.

*Primary Examiner*—Jill Warden
*Assistant Examiner*—Yolanda E. Wilkins
*Attorney, Agent, or Firm*—Woodcock Washburn Kurtz Mackiewicz & Norris LLP

[57] ABSTRACT

The present invention presents methods for, inter alia, cleaning and etching semiconductor wafers with a solution containing ammonium fluoride and control of the process used for preparing such a solution at its point of use.

10 Claims, 10 Drawing Sheets

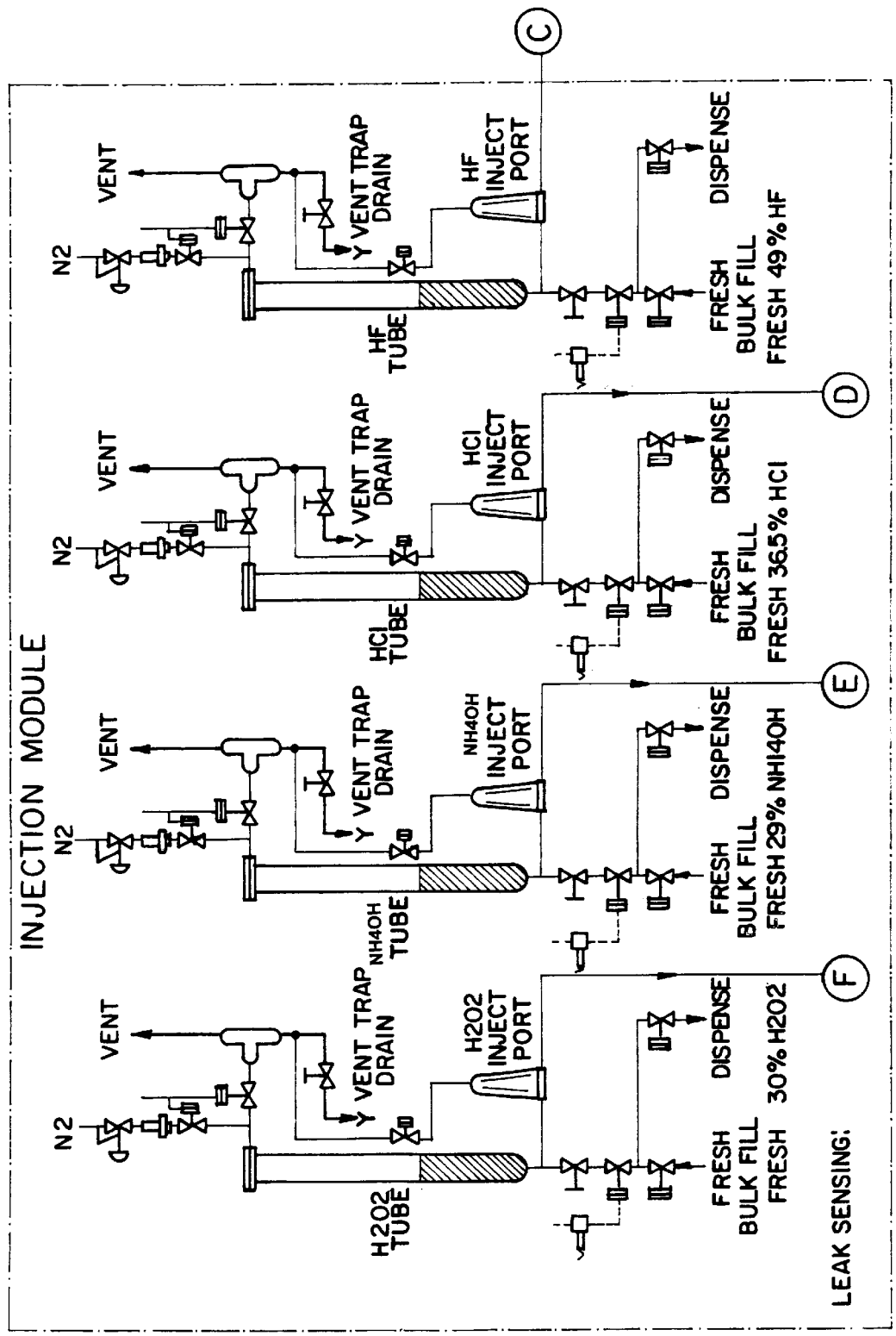

METHODS FOR TREATING SEMICONDUCTOR WAFERS

This application claims the benefit of U.S. Provisional Application Ser. No. 60/050,076 filed Jun. 13, 1997.

FIELD OF THE INVENTION

The present invention relates to the field of treating (i.e., etching and/or cleaning) semiconductor wafers with a solution containing ammonium fluoride and control of the process used for preparing such a solution at its point of use.

BACKGROUND OF THE INVENTION

Various solutions have been used to clean and etch semiconductor wafers. Recently, general cleaning solutions, and particularly solutions designed for oxide etching, have been prepared containing ammonium fluoride as the primary cleaning or etching compound. In such instances, the semiconductor processing unit is designed to store the already prepared ammonium fluoride solution, which is then used when needed by the semiconductor processor.

Such solutions have been referred to as buffered HF solutions and consist of a mixture of hydrogen fluoride (HF), which is a weak acid, and a salt of this acid, ammonium fluoride ($NH_4F$). Initially this mixture was developed to buffer dilute HF so as to obtain a constant etch rate over an extended period of time (i.e., several days to weeks). Such solutions may be referred to as Buffered HF (BHF); the term BOE (Buffered Oxide Etch) is also used to refer to these solutions. Therefore, the appropriate solution (i.e., BHF or dHF) can be selected to optimize the specific etching and/or cleaning step to be performed.

It was discovered, however, that buffered hydrogen fluoride has slightly different properties than dilute HF, aside from the buffering, which can be used to a semiconductor processor's advantage in several occasions.

The major difference between BHF and dHF (dilute HF) is the different pH of the solutions. BHF has a pH of around 3 to 5, whereas dHF has a pH of around 1 to 2. Thus, the active species in the solutions is different.

The use of a BHF solution is attractive in some semiconductor processing applications because: (1) resist is more "stable in" to BHF than to dHF (dilute HF) as a result of BHF's higher pH; (2) BHF has different etch selectivity than dHF (e.g., BHF is used when the BPSG (borophosphosilicate glass) versus thermal oxide has to be lower than the selectivity obtained in dHF; or BHF can also obtain the opposite if formulated right (i.e., it can also offer much higher etch rates for BPSG than thermal oxide); (3) BHF offers higher oxide etch rates than dHF for the same fluoride concentration; (4) BHF also offers higher nitride etch rates; (5) BHF terminates the surface differently than dHF; and (6) the higher pH of the BHF may in certain cases offer an improved particle performance depending on the particular action of the zeta potential.

In conventional BHF techniques, the solution is premixed and then employed in a wet processing unit. There are various problems associated with the use of premixed BHF. For example, particle formation tends to be an issue; such particles may compromise the integrity of the final product. Etch uniformity is limited due to the high viscosity and surface tension of BHF, the high etch rate, and, in the case of a wet bench, the continuous etching during insertion or removal of the wafers from the processing tanks and into the rinse tank. Also, because premixed BHF is typically used for an extended period of time, sometimes up to a week, there is the potential to introduce metallic impurities into the process liquids, which could again, compromise the integrity of the final product. Further, BHF tends to crystallize at temperatures below 16–17° C. which poses a problem for commercial transportation of the premixed chemical from various locations (i.e., supplier to water processing plant). Because premixed BHF has a high viscosity and surface tension, a surfactant is generally required to improve its wetting properties and to reduce particle formation. Finally, with premixed BHF, one is limited to the premixed ratio of $NH_4F$ to HF, typically mixing ratios of 6:1, 7:1 or 10:1, limiting flexibility in processing. The use of premixed BHF also is expensive.

Although there are significant benefits to using BHF to treat electronic component precursors, there is a need to reduce the problems associated with premixed BHF. The present invention addresses these as well as other needs.

SUMMARY OF THE INVENTION

The present invention provides improved methods for cleaning or etching semiconductor wafers, and particularly for oxide etching semiconductor wafers, using a cleaning/etching aqueous solution that contains ammonium fluoride ($NH_4F$) and preferably also contains hydrogen fluoride (HF)(or hydrofluoric acid). Such a solution can also be referred to as a buffered HF solution (BHF) or a buffered oxide etch (BOE) solution. The methods of the present invention provide for the preparation of such a BHF solution directly at the point of use of the solution within the semiconductor processing area, or "fab" by mixing hydrofluoric acid with a base or by injecting them into a process vessel. Hydrofluoric acid and ammonium hydroxide may used to formulate the solution. In such a way, the present invention provides great advantages to a semiconductor processor. One advantage is that the semiconductor processor can incorporate the methods of the present invention into its operation without significant retrofitting because the raw material reagents—aqueous solution of hydrogen fluoride (hydrofluoric acid) and aqueous solution of ammonium hydroxide—are already used for other processing steps; thus, the present invention allows the processor to eliminate an entire chemical reagent (premixed BHF) from the processing area. Another advantage is that the present methods may reduce problems with particles in the processing system. Additionally, the present invention may provide improved etch uniformity over conventional BHF techniques. A further advantage is that the present invention may provide improved purity for the BHF solution with a lower concentration of metallic impurities. Finally, the present invention allows any mixing ratio at point of use providing increased processing flexibility. The mixing ratio can be easily changed at any run.

By using a point of use BHF solution, it has been observed that the particle counts were generally negative at 0.16 $\mu$m, typically something like −100 to −200. Further, using point of use BHF, etch uniformities of 2–3% can readily be obtained, even without optimization for etch uniformity. Problems of contamination with metallic impurities and crystallization are minimized, if not eliminated using point of use BHF. Coinjected BHF does not generally require the use of surfactants and it also allows one to deliver any mixing ratio of $NH_4F$ to HF, which is beneficial because it provides for added flexibility in wet processing techniques allowing etch rate and selectivity to be optimized for a given semi-conductor process. Coinjected BHF is also more cost efficient because there is (1) no need for extra chemical lines in the clean room because the individual chemicals are typically used in other wet processing steps; (2) no need for extra chemicals to be qualified and quality controlled, again, because the individual chemicals are typically used in other wet processing steps; and (3) no need for surfactant-chemical waste processing.

In one embodiment of the present invention, the method for treating semiconductor wafers with a solution containing ammonium fluoride, comprises the following steps. First, there is provided a source of ammonium hydroxide ($NH_4OH$) and a source of hydrogen fluoride (HF). Then an amount of ammonium hydroxide is transferred from the source of ammonium hydroxide to a treatment vessel and an amount of hydrogen fluoride is transferred from the source of hydrogen fluoride to the treatment vessel to prepare a treatment solution comprising ammonium fluoride ($NH_4F$) and HF. A plurality of semiconductor wafers are contacted with the treatment solution to remove waste material from the semiconductor wafers.

It is preferred that in the resulting treatment solution the molar concentration of $NH_4F$ is from about 0.02 to about 20 and the molar concentration of HF is from about 0.01 to about 30. Preferably $NH_4F$ is 0.10–10 moles/liter and HF range is 0.10–20 moles/liter.

The treatment solution may be used for various reasons, such as oxide, nitride, or titanium (without limitation) etching the surfaces of semiconductor wafers, or general cleaning of the semiconductor wafers.

DETAILED DESCRIPTION OF THE INVENTION

Figure 1:
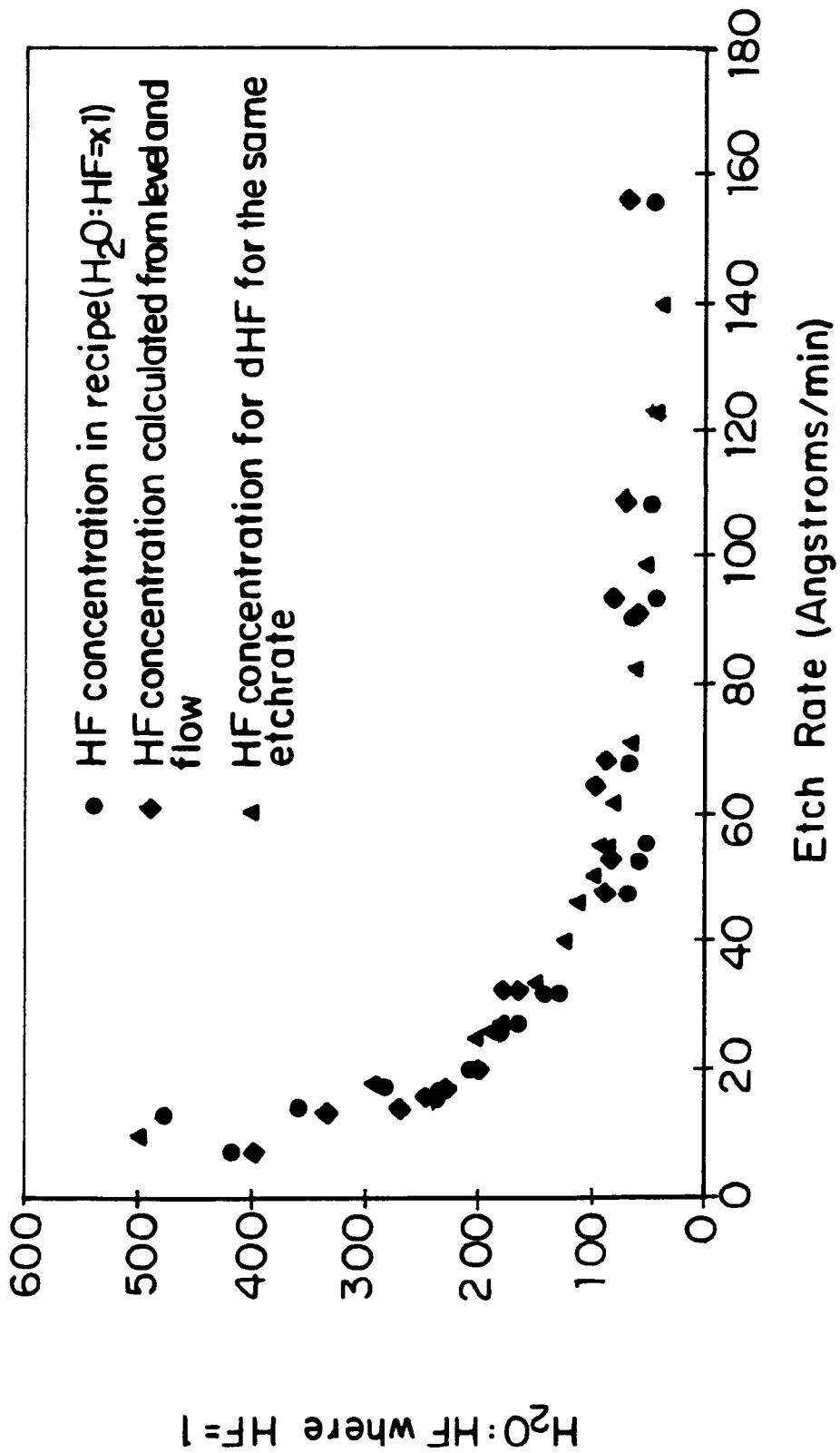
FIG. 1 depicts the correlation between etch rate and fluoride concentration.

The terminology "reactive process liquid," "reactive chemical process liquid," "processing liquid," "chemical liquid," "active chemical," "reactive chemical process liquid," or "treatment solution," as used herein, refers to the reactive liquids that electronic component precursors are exposed to during their manufacture and perform some action on the surface electronic component precursors, as distinguished from a rinsing liquid such as Dl water. These terms may be used interchangeably. When used in connection with the terminology "process liquid," "reactive" or "active" means, without limitation, a process liquid that has some activity in removing contamination such as particulate, metallic impurities, or organic from the surface of the electronic component precursor, or has some activity in etching the surface of the electronic component precursor, or active in growing an oxide layer on the surface of the electronic component precursor. An example of such a reactive chemical process liquid is an aqueous solution of hydrofluoric acid (HF), which may have a concentration greater than 1000:1 ($H_2O$:HF).

The terminology "nonreactive chemical process liquid," as used herein, refers to a process liquid that does not necessarily have any activity in, for example, removing contaminants from the electronic component precursors, and may include rinse liquids.

The terminology "chemical treatment step," as used herein, refers to exposing the electronic component precursors to one reactive chemical process liquid.

The terminology "treating," as used herein, refers to some active step being performed on an electronic component precursors, such as cleaning or etching.

The terminology "wet processing treatment," as used herein, refers to exposing the electronic component precursors to one or a series of process liquids to, for example, clean or etch the surfaces of the electronic component precursors.

The terminology "rinsing liquid" or "rinse liquid," as used herein, refers to Dl water or some other liquid that is used to rinse the electronic component precursors after exposure to a reactive chemical process liquid, as compared to treating them with a chemical. A rinse liquid may be Dl water or a very dilute aqueous solution of a chemical (e.g., hydrochloric acid) to prevent, for example, metallic deposition on the surface of the electronic component precursors during rinsing (using very dilute solution of hydrochloric acid). Ozone is another additive used during rinsing. The chemical concentration in such rinsing liquids is minute; generally, the concentration is not greater than about 100 ppm. The primary goal of the rinsing liquid is to remove chemicals or reaction products from the surface of the electronic component precursors, and not to perform some "reactive" process to the surface(s) of the electronic component precursors.

The terminology "reaction chamber," as used herein, refers to vessels, full flow vessels or single tank systems, baths, wet benches and other reservoirs suitable for wet processing methodologies. This terminology is interchangeable with the terminology "treatment vessel."

As used herein, the terminology "full flow vessel," refers to a vessel that is closed to the environment and is employed in a "full flow method," or sometimes called one bath systems.

As used herein, the terminology "electronic component precursors" includes, without limitation, semiconductor wafers, flat panels, and other components used in the manufacture of electronic components (i.e., integrate circuits).

The methods of the invention are generally applicable to any wet processing equipment. Reaction chambers suitable for practicing the claimed invention include, without limitation, full flow vessels, single chambers, wet benches (baths), and spray cleaning systems. See, e.g., Chapter 1: Overview and Evolution of Semiconductor Wafer Contamination and Cleaning Technology by Werner Kern and Chapter 3: Aqueous Cleaning Processes by Don C. Burkman, Donald Deal, Donald C. Grant, and Charlie A. Peterson in Handbook of Semiconductor Wafer Cleaning Technology (edited by Werner Kern, Published by Noyes Publication Parkridge, N.J. 1993), and Wet Etch Cleaning by Hiroyuki Horiki and Takao Nakazawa in Ultraclean Technology Handbook, Volume 1, (edited by Tadahiro Ohmi published by Marcel Dekker), the disclosures of which are herein incorporated by reference in their entirety. A particularly preferred wet processing system is CFM Technology's 8100 Full-Flow™ system.

Semiconductor fabrication is described generally, for example, in P. Gise et al., Semiconductor and Integrated Circuit Fabrication Techniques (Reston Publishing Co. Reston, Va. 1979), the disclosures of which are herein incorporated by reference in their entirety.

The reactive chemical process liquids suitable for practicing the invention include, without limitation, aqueous solutions of hydrochloric acid and buffers comprising the same, ammonium hydroxide and buffers comprising the same, hydrogen peroxide, sulfuric acid and buffers comprising the same, mixtures of sulfuric acid and ozone, hydrofluoric acid and buffers comprising the same, chromic acid and buffers comprising the same, phosphoric acid and buffers comprising the same, acetic acid and buffers comprising the same, nitric acid and buffers comprising the same, ammonium fluoride buffered hydrofluoric acid, ammonium hydroxide and buffers comprising the same, and hydrofluoric acid and buffers comprising the same, and combinations thereof. BHF can be used at anytime during a wet processing technique. The particular process liquids used, the equipment used, the exposure time, and the experimental conditions (i.e., temperature, concentration, and flow of the process liquid) will vary depending on the particular purpose of the particular wet processing methodology.

The reactive chemical process liquids may further contain additional additives such as surfactants, complexing or chelating agents, and corrosion inhibitors.

The nonreactive chemical process liquids suitable for practicing the invention include, without limitation, deionized water or very dilute solutions of deionized water and/or chemical. Examples of such chemicals include, without limitation, hydrochloric acid, hydrofluoric acid, nitric acid, hydrogen peroxide, ozone, and surfactant.

After chemical treatment, the electronic component precursors may be dried using any method known to those skilled in the art.

The methods of the invention may be used for etching or cleaning the surfaces of semiconductor wafers to remove any unwanted layer or part thereof from the silicon surface, such as an oxide layer, a nitride layer, an aluminum layer, a titanium layer (without limitation). The present invention may also be used in controlled oxide etching.

The present invention provides methods for using a buffered, aqueous hydrogen fluoride (BHF) solution that contains hydrogen fluoride (HF), which is a weak acid, and a salt of this acid, ammonium fluoride ($NH_4F$). This BHF solution is used, inter alia, to clean or etch electronic component precursors such as semiconductor wafers, flat panels, and other electronic component precursors. Hereinafter, the invention will be described with respect to cleaning or etching semiconductor wafers as representative of electronic component precursors. The cleaning or etching step accomplished by such BHF solutions can include general cleaning of the wafers, and is particularly applicable to oxide etching of the wafers. The invention, however, is not limited to such cleaning.

In accordance with the present invention, the BHF solution is prepared directly at the site of its end use. The BHF can be prepared in a mixing tank from its individual components and then transferred to a treatment vessel which is in fluid communication with the mixing tank, or the BHF can be prepared in the treatment vessel itself. In such a way, the BHF solution can be prepared within the processing room of the semiconductor processor with chemical reagents typically used in other processing aspects of such wafers. This allows for the minimization of raw chemical reagents that need to be stored in the processing area, or "fab," and thereby streamlines the processing area.

A typical processing area for treating semiconductor wafers will have storage tanks for chemical reagents, such as ammonium hydroxide ($NH_4OH$) and hydrofluoric acid (HF). These reagents are typically stored in their concentrated form. For $NH_4OH$, a concentrated solution will typically be about 29% wt. aqueous solution; for HF, a concentrated solution will typically be about 49% wt. aqueous solution. These solutions can also be kept in a diluted form, with the lowest concentration of the $NH_4OH$ solution being about 400 parts water:1 part $NH_4OH$ and the same lowest concentration for the HF solution.

In accordance with the methods of the present invention, a BHF process solution is prepared directly within the processing area at the point of its use to clean and/or etch the semiconductor wafers. In one embodiment, there is prepared a BHF process solution within a treatment vessel. The treatment vessel is in liquid communication with the storage tanks for the $NH_4OH$ and for the HF solutions. A control valve and a control pump can be used as processing equipment between these storage tanks and the treatment vessel. In such a way, a processing control system, such as a personal computer, can be used as a means to control and monitor the addition rates of each solution, the $NH_4OH$ and for the HF solutions, into the treatment vessel to prepare the processing solution.

The BHF process solution will be prepared by mixing together a selected quantity of the $NH_4OH$ aqueous solution and a selected quantity of the HF aqueous solution. The reaction of these two compounds will form $NH_4F$. The two reactant species are combined in a ratio such that there is a molar excess of HF to produce a final BHF process solution that contains both $NH_4F$ and HF. It is preferred that the BHF process solution contain a molar concentration (moles/liter of solution) of $NH_4F$ in the range of from about 0.02 to about 20, and that it also contain a molar concentration of HF in the range of from about 0.01 to about 30. Preferably $NH_4F$ is 0.10–10 moles/liter and HF range is 0.10–20 moles/liter. The BHF process solution can also be prepared without an excess of HF, such that there is no detectable amount of HF in the BHF process solution, although it is preferred to have an excess of HF present.

After the $NH_4OH$ solution and the HF solutions have been transferred into the treatment vessel to form the BHF process solution, the equipment used to transfer those reagents, e.g., any pumps and/or valves, can be shut down. The BHF process solution is now in a form to be used at the point of its end use to clean and/or etch silicon wafers. This step can be accomplished by any of the variously known contacting steps. One such method is to immerse the wafers into the BHF process solution within the treatment vessel. Another method is to flow the BHF process solution over the wafers or to spray the process solution onto the wafers.

The temperature of the BHF process solution can be maintained between about 3° C. and about 90° C., preferably between about 15° C. and 70° C., most preferably between 20° C.–40° C.

The process of mixing the separate $NH_4OH$ and the HF solutions to form the BHF process solution can be automated to an extent. That is, the known concentrations of these solutions can be entered into a computer and a program can then be used to control the addition rate of each solution to produce the desired concentration of $NH_4F$ and HF in the final BHF process solution.

The BHF process solution of the present invention is preferably used in oxide etching processing steps to remove silicon oxides from the surfaces of semiconductor wafers. The unwanted oxides include PBSG oxides and thermal oxides.

The preparation of the BHF process solution in accordance with the present invention at the point of its use within the processing area provides many benefits to the prior technique of storing a solution of $NH_4F$ in the processing area and transferring that solution directly into the treatment vessel to be used as the process solution. For instance, use of the present methods may significantly decrease the accumulation of particles in the processing system. Also, the methods of the present invention may improve the uniformity of the etching process. In accordance with the present invention, any mixing ratio is possible between the HF solution and the $NH_4OH$ solution. Further, the process of the present invention results in the simplification of the processing area because the space and equipment necessary to deal with a separate $NH_4F$ solution are saved.

Without departing from the spirit of the invention, the BHF solution can be formulated at point of use by mixing hydrfluroic acid with a base, with ammonium hydrooxiude being the preferred base. Other bases suitable for practicing the invention include, without limtiation, tetramethly ammonium hydrtoxide.

The following examples are for illustrative purposes and are not intended to limit the invention.

EXAMPLES

Example 1

Experimental Determination of Co-injected BHF Rates and Selectivity

1. Experimental design

In a first experimental series of 23 etching experiments thermal oxide and silicon nitride wafers were used to scan the entire dynamic range of mixing of $NH_4OH$ and HF. The mixed or coinjected HF was varied such that the excess amount of HF (more HF than the amount required just to form $NH_4F$) for every $NH_4OH$ mixing amount (or injection) spanned between 10% and 100%.

In a second experimental series, 8 etching experiments were chosen from these 23 previous experiments to investigate the BHF etching selectivity of thermal oxide etching versus BPSG and TEOS oxide.

Both etch rate and selectivity experiments were performed in a CFM technology 8100 Full-Flow™ System.

2. Dynamic range

The dynamic range for injection of $NH_4OH$ ranges from 400:1 to 3:1 in a CFM Technologies 8100 Full-Flow™ system. In the presence of excess HF, every mole of $NH_4OH$ will react together with HF to form one mole of $NH_4F$ and therefore the dynamic range of $NH_4F$ in CFM Technologies 8100 Full-Flow™ system is 0.0426 mole/l to 5.686 mole/l. If $NH_4F$ would be supplied in a 40%-w solution, then this would correspond to a dilution of 254:1 and 1.89:1 dilution of $H_2O:NH_4F$ (40% w). Or alternatively said, the dynamic range of the CFM Full-Flow corresponds to $NH_4F$ or $NH_4OH$ concentrations of between 0.15%-w and 21%-w.

This dynamic range was explored while adjusting the excess HF concentration from 10% to 100% of the $NH_4F$ concentration (excess HF is varied from 10% to 100% of $NH_4F$ molar concentration).

3. Experiments a. Design of experimental conditions

The experimental design of the first series of experiments is shown in Table 1. In this table, the injected ratios are shown with respect to a basis for HF (i.e., $H_2O:NH_4OH:HF$). The $NH_4F$ spans the entire dynamic range of the CFM 8100 Full-Flow™ (400:1 to 10:1). The $[HF]/[NH_4F]$ ratio varies between 10% and 100%.

In a second set of experiments 8 etching experiments were chosen to run with different types of oxides. In each run 5 wafers were used: 1 native oxide wafer for particle addition test, and 1 thermal oxide wafer, 1 BPSG wafer, one TEOS wafer, and 1 silicon nitride wafer. The last four wafers were tested for etch uniformity and selectivity.

4. Results

The recipe for BHF in a CFM Full-Flow™ 8100 looks similar to an SC1 ($H_2O_2$, $NH_4OH$, and $H_2O$) or SC2 ($H_2O_2$, HCl, and $H_2O$) step. The step is called $HF/NH_4OH$. An example of a set of reaction conditions that may be used for a run in a CFM 8100 Full-Flow™ System is as follows:

| | |
|---|---|
| Condition flow | 20 gpm |
| Condition temp | 35° C. |
| Inject Time | 60.0 Secs |
| Soak Time | 60.0 Secs |
| Ratio Water | 100 |
| Ratio HF | 0.77 |
| Ratio $NH_4OH$ | 1 |
| Megasonics ON | 0.0 Secs |
| Megasonics OFF | 0.0 Secs | a. Conversion Calculations

From the volumetric ratio of $NH_4OH$ and HF to $H_2O$ in the recipe, the following items can be calculated:

If recipe input (volumetric ratios):

$H_2O$=a $NH_4OH$=b

HF=c

Then

[HF] concentration injected in mole/l as HF=c/a*1000*1.18*(49/100)/20.006*(a/(a+b−1−c))

In this formula it is assumed that the specific density of HF in a 49%-w solution is 1.18 and that the HF is supplied to the injection tubes in a 49% concentration by weight of HF. Further it is assumed that the molecular weight of HF is 20.006 g/mole. The $[NH_4OH]$ can be determined by $[NH_4OH]$ injected in mole'liter=b/a*0.9* (29/100)*1000/17*a/(a+b+c). In this formula it is assumed that the specific density of $NH_4OH$ in a 29% solution is a 0.9 and that the $NH_4OH$ is supplied to the injection tubes in a 29% concentration by weight of $NH_3$. Further it is assumed that the molecular weight of $NH_3$ is 17 g/mole.

b. Discussion and further conversions

The injected HF and $NH_4OH$ will form HF and $NHF_4$. More specifically, this HF and $NH_4F$ will further form HF, $HF_2^-$, $F^-$, $NH_4$ and higher polymers of HF such as $(HF)_2$. Alternatively the same concentration of species in the vessel could be generated by injecting HF and $NH_4F$ directly through the injection tubes. The amount of HF and $NH_4F$ that would be required in the injection tubes (hypothetically, since HF and $NH_4OH$ are really injected) to achieve equivalent concentration of active species in the vessel can be calculated. Equivalent amounts of [HF] and $[NH_4F]$ hypothetically injected (if injecting HF and $NH_4F$ instead of HF and $NH_4OH$):

$[NH_4F]$ in $NH_4F$—HF scheme=$[NH_4OH]$ in $NH_4OH$—HF scheme

[HF] in $NH_4F$—HF scheme=[HF]—[$NH_4OH$] in $NH_4OH$—HF scheme

Therefore, the ratio of [HF]/[$NH_4F$] is:

[HF]/[$NH_4F$]=([$H_4F$]—[$NH_4OH$])/[$NH_4OH$]

C. Conversion of HF/NH4F (molar to $NH_4OH$/HF (volumetric)

To convert a [HF]/[$NH_4F$] ratio into a volumetric ration of $NH_4OH$ (29%)/HF(49%) the following formula can be used:

$NH_4OH$ (29%)/HF (48.9%)=1.8825/([HF]/[$NH_4F$]+1) for [HF]/[NH4F]=0, this gives $NH_4OH$/HF=1.8825.

Therefore, the maximum volumetric ratio of $NH_4OH$ to HF injection is 1.8825.

5. Measurements a. On the wafers

Etched oxide (25 points, 6 mm edge exclusion), etched nitride (25 points, 6 mm edge exclusion), particle removal (>0.16 μm, 5 mm edge exclusion) on oxide wafers, nitride wafers, and test wafers (native oxide). Particles were measured using the Tencor Surfscan 6220 in the CFM Apps Lab. The film thickness was measured using the Rudolph FE VII-D at Rudolph Technologies in Flanders, N.J.

b. On the tool

Figure 7:
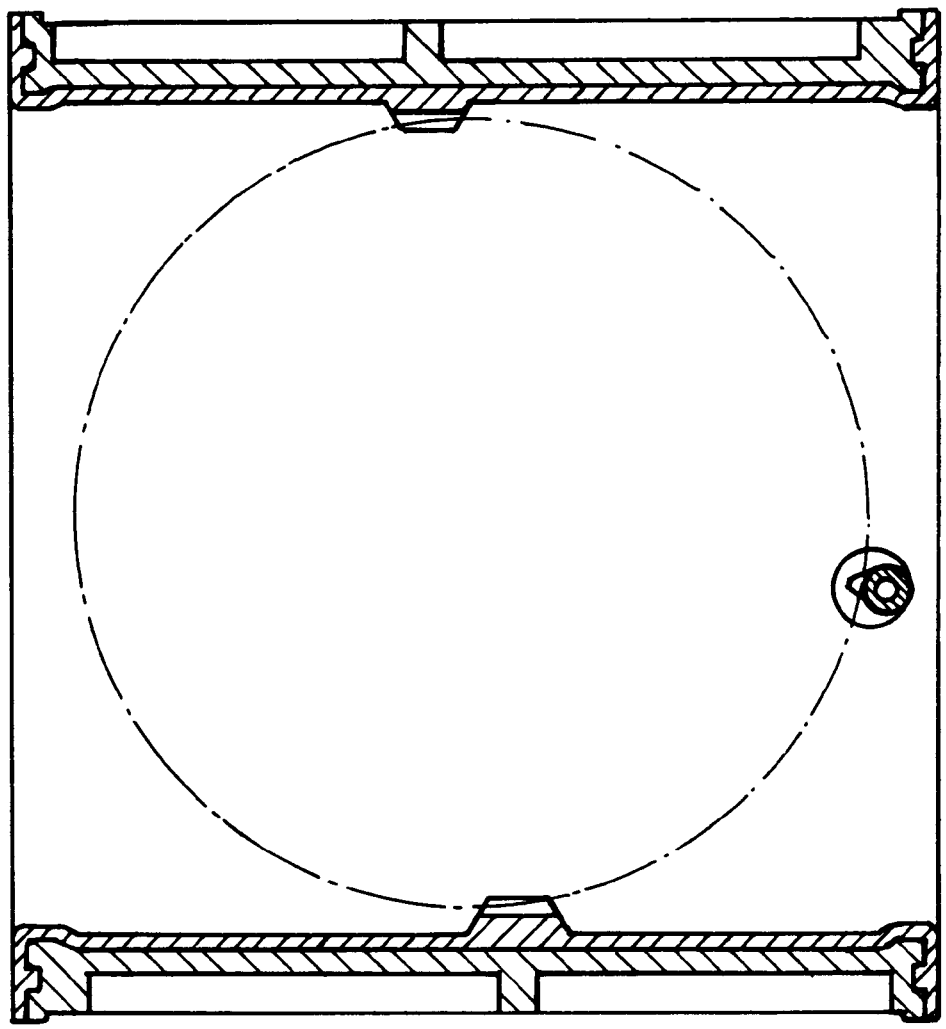
FIG. 7 depicts a wafer held in a vessel in the CFM Technology's Full-flow™ system.

Dl flow, actual volumes of chemicals injected (versus recipe volumes), temperature, conductivity at the end of the injection. Three wafers were used for each run. One nitride wafer was put into slot #22, the thermal oxide wafer was put into slot #32 and the test wafer was put into slot #42 (the slots are as depicted in FIG. 7).

6. Results of 1st and 2nd set of experiments

Since $NH_4F$ is made by mixing $NH_4OH$ and HF the data can be represented as a function of $NH_4OH$ and HF as done in Table 1. The dilution of HF with respect to $H_2O$ is given on the vertical axis and the ratio of $NH_4OH$ to HF is given on the other axis. A ratio of $NH_4OH$ to HF of 1.8825 delivers a perfect $NH_4F$ solution (ie., no excess HF). Higher ratios will form $NH_4OH$ and $NH_4F$. instead of HF and $NH_4F$.

TABLE 1

Thermal oxide etch rate at 40° C. in A/min. Some runs were run at 35° C. The runs at 35° C. are printed in smaller characters. The data is now presented as a function of $NH_4OH$ and HF. The $NH_4OH$ and $H_2O$ is giving in volumetric ratios compared to 1 part HF. Thus, the volumetric ratio is presented as H2O:$NH_4OH$:1, where 1 is HF. The data for 0 $NH_4OH$ is the standard CFM data for dilute HF solutions.

| $NH_2$ $H_2O$:HF | 0 | 0.85 | 0.70 | 0.73 | 0.74 | 0.75 | 0.76 | 0.78 | 0.81 | 0.84 |
|---|---|---|---|---|---|---|---|---|---|---|
| 500.1 | 10 | | | | | | | | | |
| 400.1 | | | | | | | | | | |
| 357.1 | | | | | | | | | | |
| 333.1 | | | | | | | | | | |
| 294.1 | | | | | | 18 | | | | |
| 270.1 | | | | | | | 14 | | | |
| 250.1 | | | | 16 | | | | | | |
| 232.1 | | | | | | | | 17 | | |
| 204.1 | | | | | 20 | | | | | |
| 200.1 | 25 | | | | | | | | | |
| 189.1 | | | 26 | | | | | | | |
| 182.1 | | | | | | | | | 27 | |
| 175.1 | | 32 | | | | | | | | |
| 154.1 | | | | | | | | | | 32 |
| 150.1 | 33 | | | | | | | | | |
| 147.1 | | | | | | | | | | |
| 127.1 | | | | | | | | | | 35C/36 |
| 125.1 | 40 | | | | | | | | | |
| 116.1 | | | | | | | | | | |
| 111.1 | 48 | | | | | 35C/46 | | | | |
| 101.1 | | | | | | | | | | |
| 100.1 | 50 | | | | | | | | | |
| 98.1 | | | | | | | | | | |
| 92.1 | | | | | | 68 | | | | |
| 90.1 | 5 | | | | | | | | | |
| 89.1 | | | | | | | | | | |
| 88.1 | | | | | | | | | | |
| 85.1 | | | | | | | | | | |
| 80.1 | 82 | | | | | | | | | |
| 74.1 | | | | | | | | | | |
| 70.1 | 71 | | | | | | | | | |
| 68.1 | | | | | | | | | | |
| 65.1 | | | | | | | | | | |
| 63.1 | | | | | | | | | | |
| 60.1 | 83 | | | | | | | | | |
| 53.1 | | | | | | | | | | |
| 50.1 | 99 | | | | | | | | | |
| 48.1 | | | | | | | | | | |
| 40.1 | 123 | | | | | | | | | |
| 37.1 | | | | | | | | | | |
| 35.1 | 140 | | | | | | | | | |
| 29.1 | | | | | | | | | | |
| 23.1 | | | | | | | | | | |
| 16.1 | | | | | | | | | | |
| 13.1 | | | | | | | | | | |
| 11.1 | | | | | | | | | | |

TABLE 1-continued

Thermal oxide etch rate at 40° C. in A/min. Some runs were run at 35° C. The runs at 35° C. are printed in smaller characters. The data is now presented as a function of $NH_4OH$ and HF. The $NH_4OH$ and $H_2O$ is giving in volumetric ratios compared to 1 part HF. Thus, the volumetric ratio is presented as $H2O:NH_4OH:1$, where 1 is HF. The data for 0 $NH_4OH$ is the standard CFM data for dilute HF solutions.

| $NH_2$ $H_2O:HF$ | 0.97 | 0.99 | 1.1 | 1.5 | 1.7 | 1.6 | 1.88 | 2.0 | 2.1 | 2.4 |
|---|---|---|---|---|---|---|---|---|---|---|
| 500.1 | | | | | | | | | | |
| 400.1 | | 7 | | | | | | | | |
| 357.1 | | | | | | | | | | |
| 333.1 | | | | | | | | | | |
| 294.1 | | | | | | | | | | |
| 270.1 | | | | | | | | | | |
| 250.1 | | | | | | | | | | |
| 232.1 | | | | | | | | | | |
| 204.1 | | | | | | | | | | |
| 200.1 | | | | | | | | | | |
| 189.1 | | | | | | | | | | |
| 182.1 | | | | | | | | | | |
| 175.1 | | | | | | | | | | |
| 154.1 | | | | | | | | | | |
| 150.1 | | | | | | | | | | |
| 147.1 | 35C/21 | | | | | | | | | |
| 127.1 | | | | | | | | | | |
| 125.1 | | | | | | | | | | |
| 116.1 | | | 35C/21 | | | | | | | |
| 111.1 | | | | | | | | | | |
| 101.1 | | | | 19 | | | | | | |
| 100.1 | | | | | | | | | | |
| 98.1 | | | | | | | | | | |
| 92.1 | | | | | | | | | | |
| 90.1 | | | | | | | | | | |
| 89.1 | | | | | | | | | | |
| 88.1 | | | | | | | | | | |
| 85.1 | | | | | | | | | | |
| 80.1 | | | | | | | | | | |
| 74.1 | | | | | | | | | | |
| 70.1 | | | | | | | | | | |
| 68.1 | | | | | | | | | | |
| 65.1 | | | | | | | | | | |
| 63.1 | | 156 | | | | | | | | |
| 60.1 | | | | | | | | | | |
| 53.1 | | | | | | | | | | |
| 50.1 | | | | | | | | | | 2 (Si etched) |
| 48.1 | | | | | | | | | 129 (Si etched) | |
| 40.1 | | | | | | | | | | |
| 37.1 | | 411(?) | 247 | | | 83 | | | | 3 (Sietched) |
| 35.1 | | | | | | | | | | |
| 29.1 | | | | | | | | | he) | 3 (Sietched) |
| 23.1 | | | | | | 263 | | 37 | | 3 (Sietched) |
| 16.1 | | >840 | | | >353 | 404 | | | | |
| 13.1 | | | | >528 | | | | | | |
| 11.1 | | | | | | | | | | |

In the literature, H. Kikuyama, N. Miki, K. Saka, J. Takano, I. Kawanabe, M. Miyashita and T. Ohmi, IEEE Trans. On Semic. Manuf., Vol.4, no. 1, 26 (1991), it is reported that the highest etch rate is obtained for equal molar ratios of HF and $NH_4F$. In terms of volumetric ratios of $NH_4OH$ and HF, this corresponds to a volumetric ratio of $NH_4OH/HF=0.94$.

If the etch data for mixed solutions of $NH_4OH$ and HF for a ratio range of 1:0.86 to 1:1.2 are plotted together with the etch data for dilute HF on a graph versus the HF dilution, FIG. 1 results. FIG. 1 illustrates that the influence of the [$NH_4OH$] on the etch rate is increasingly important for dilutions of 100:1 and lower. At a dilution of 100:1, the etch rate in BHF is about 20% higher, at a dilution of 70:1, the etch rate in BHF is about 50% higher and at a dilution of 63:1, the etch rate in BHF is about 100% faster than in dHF solutions with the same HF concentration. It seems that for dilutions higher than 100:1 the etch rate does not depend greatly on the $NH_4OH$ concentration. These results agree very well with theory.

In BHF, there are following species present: $H^+$, $OH^-$, $F^-$, $HF_2^-$, HF and $(HF)_2$. In dilute HF, the primary etchants are the undissociated HF molecule and the $(HF)_2$ dimer acting as the etchant. In BHF, $HF_2^-$ also etches the oxide. $HF^{2-}$ etches the oxide roughly 4 times faster than $(HF)_2$ and/or HF. The presence of $HF_2^-$ in the solution is strongly dependent on the pH of the solution.

Figure 2:
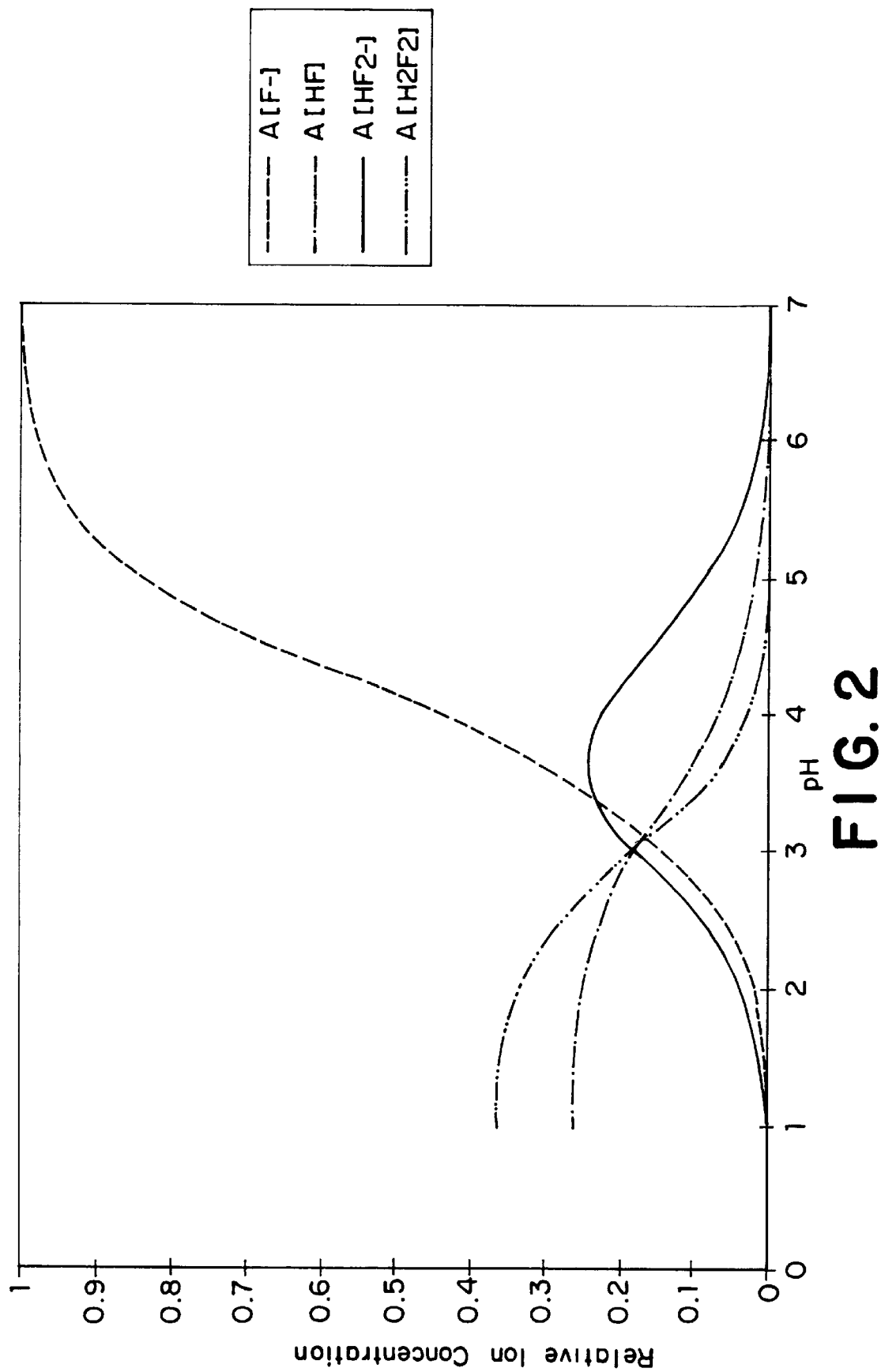
FIG. 2 depicts the relative (fractional of the total fluoride concentration) concentration of the different species in a BHF solution as a function of pH for a total fluoride concentration of 2 mole/l (corresponding to a 14:1 dilution of $H_2O$:HF).
Figure 3:
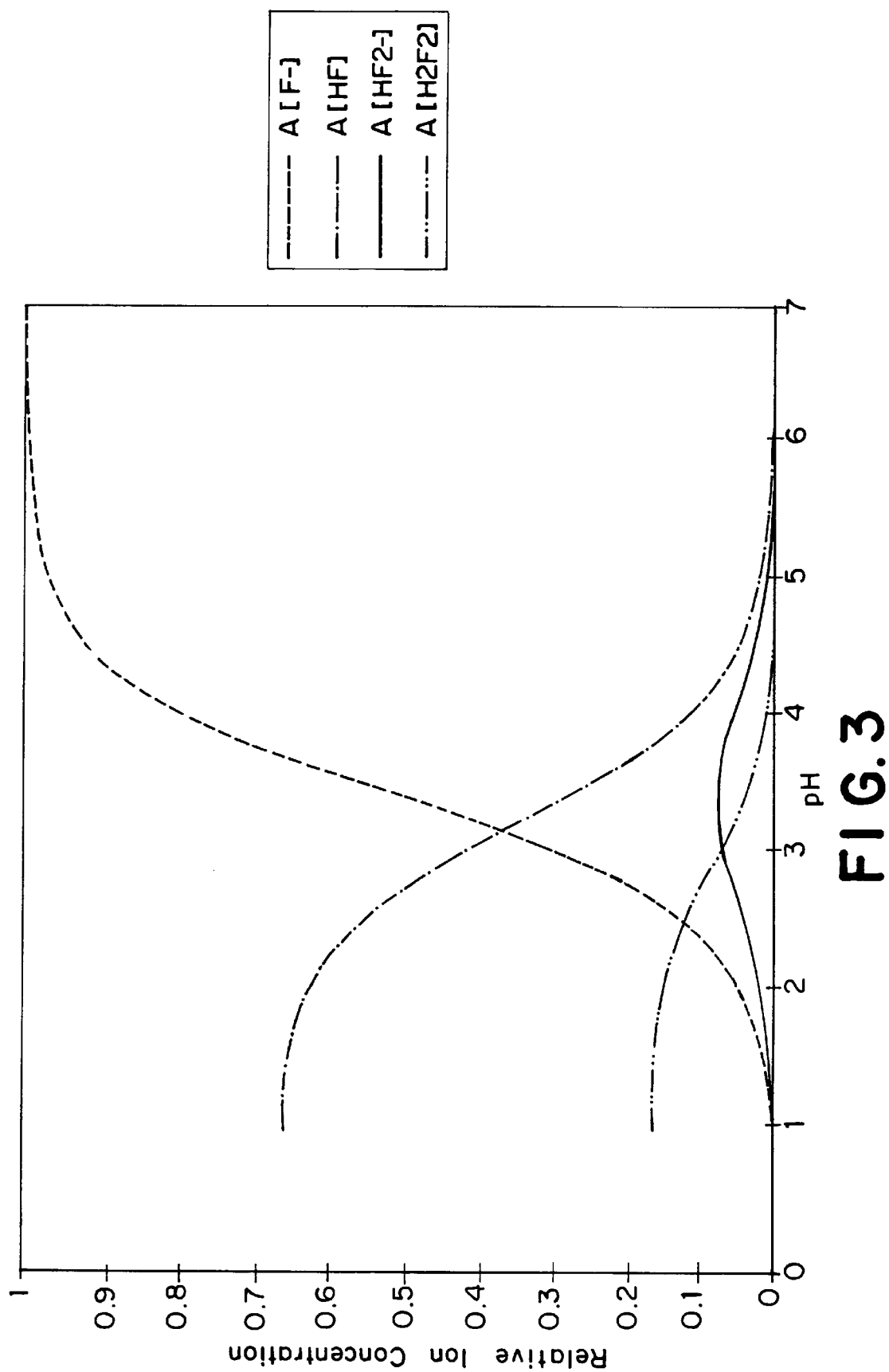
FIG. 3 depicts the relative concentration of the species in BHF as a function of pH for a total fluoride concentration of 0.14 mole/l.

At pH values between 3 and 5, the [$HF_2^-$] concentration is much higher than the (HF) or $(HF)_2$ concentration, as shown in FIG. 2. However, this situation changes drastically for dilute solutions. The same graph is shown in FIG. 3 for the case of a 200:1 solution, corresponding to a molar concentration of 0.14 mole/l. In FIG. 3, the [$HF_2^-$] concentration still goes through a maximum for ph values between 3 and 5, but the [$HF_2^-$] concentration is always much lower than the [HF] concentration. The ratio of $[HF_2^-]$ versus [HF] can be calculated as a function of the dilution for a fixed pH value.

Figure 4:
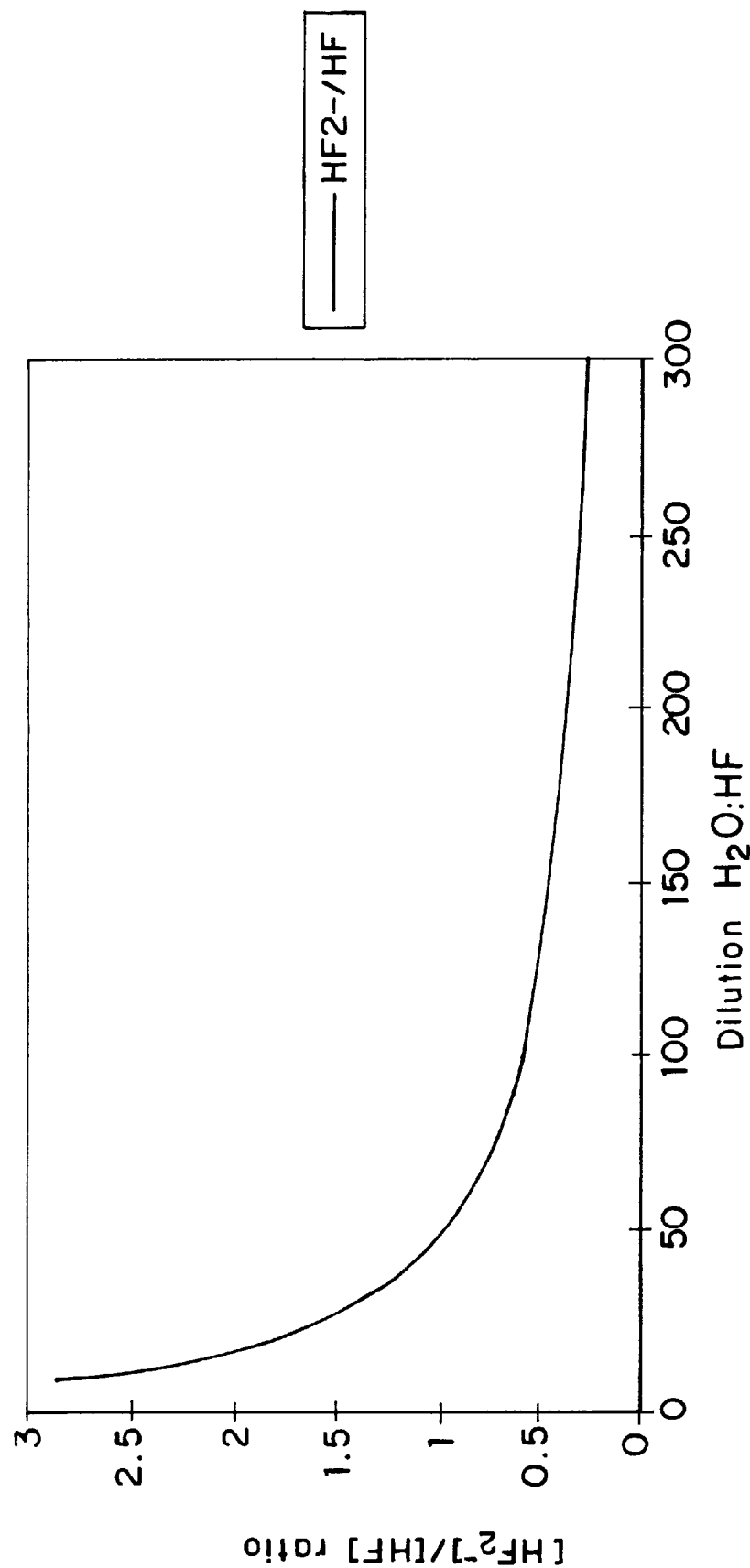
FIG. 4 depicts the ratio of $[HF_2^-]/[HF]$ as a function of the dilution of $H_2O$:HF.
Figure 5A:
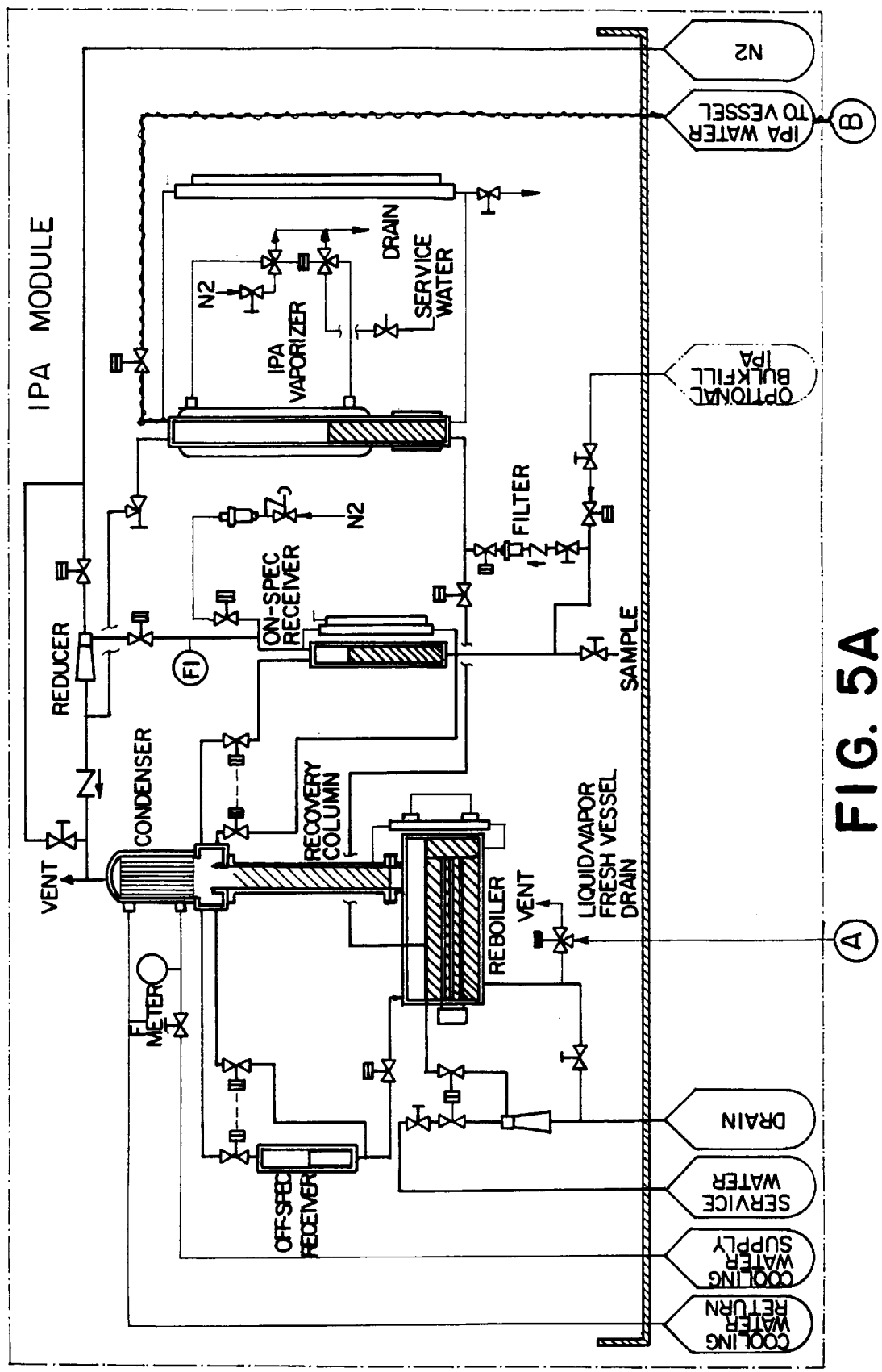
FIG. 5 depicts CFM Technology's 8100 Full-Flow System, which is an example of a wet processing system that may be used for practicing the claimed invention.
Figure 5B:
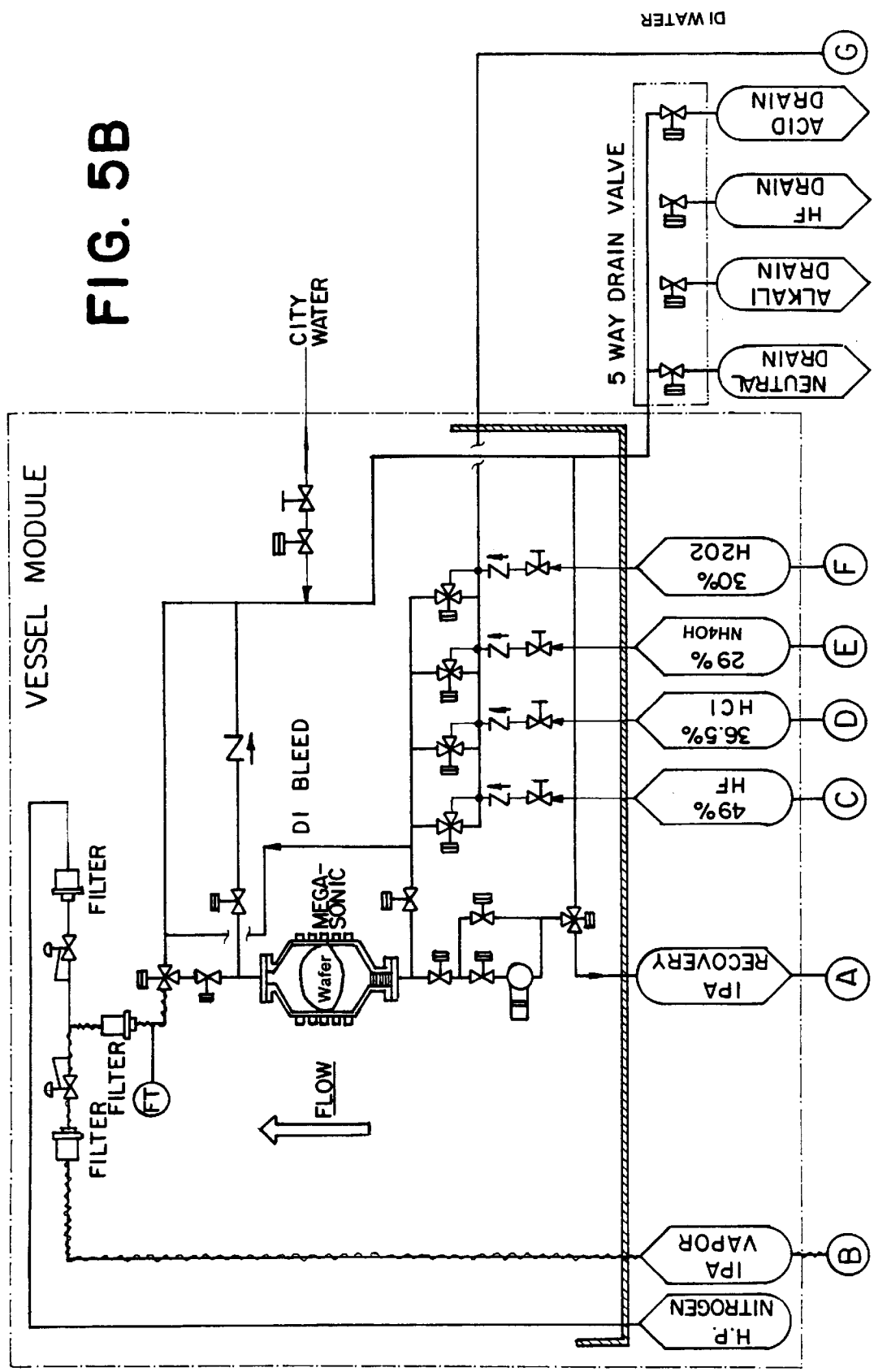
Figure 5D:
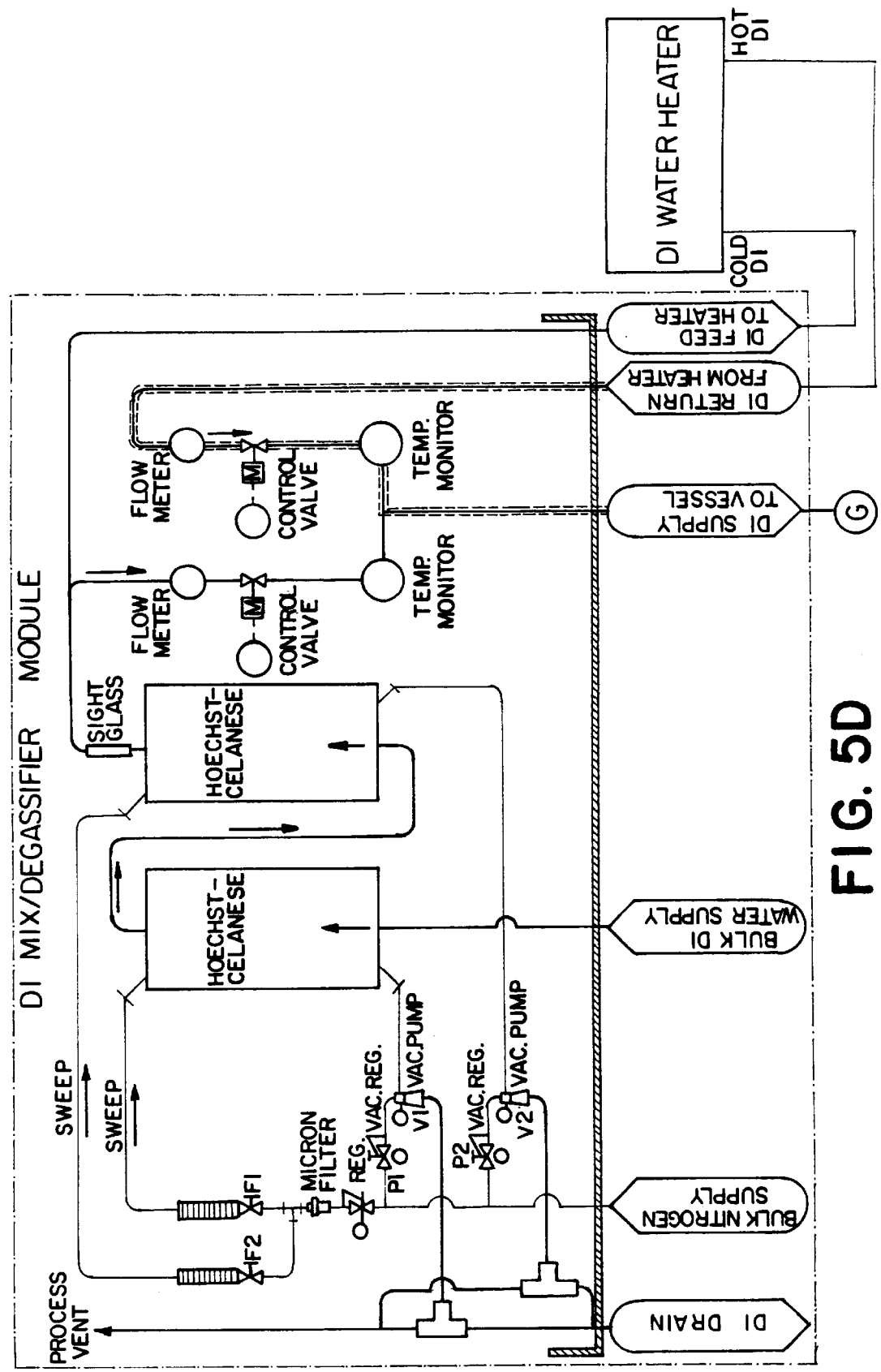
Figure 6:
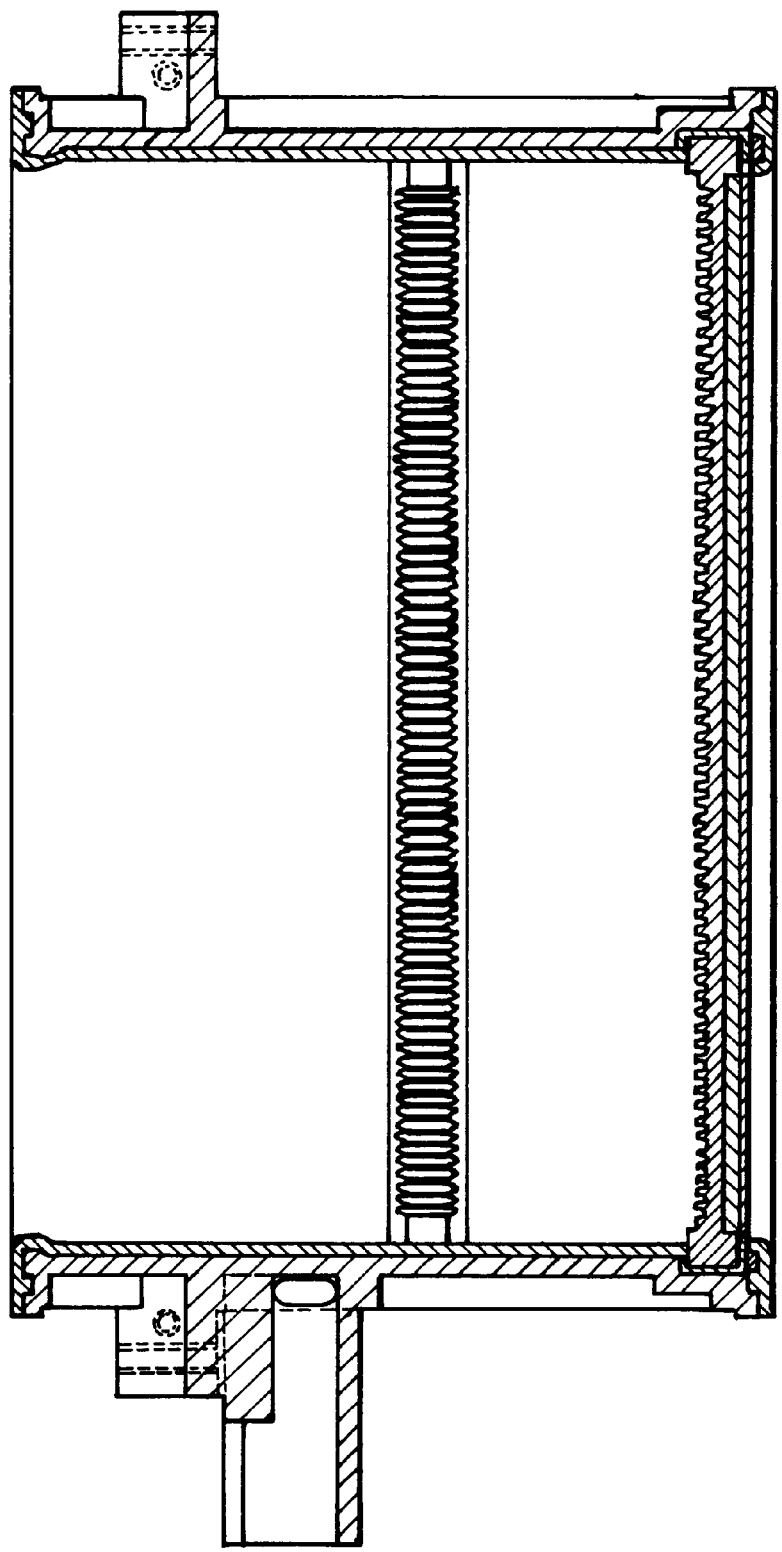
FIG. 6 depicts a vessel area of the unit of FIG. 5 showing the slots where the electronic precursors are placed during treatment.

For a pH value of 3.6 the ratio of $[HF_2^-]$ versus [HF] is shown in FIG. 4. The concentration of $HF^{2-}$ only becomes significant for dilutions less than a 100:1, illustrating why the addition of $NH_4OH$ to HF only increases the etch rate for dilutions less than 100:1. Even though the addition of $NH_4OH$ to HF for more dilute solutions does not alter the etch rate, it will still modify the pH which is important in patterned etches, where higher pH values are less aggressive to the resist. Additionally, there may be a slightly different surface termination depending on the pH, since there will be more $F^-$ in the solution. Even though $F^-$ does not etch $SiO_2$, it can still interact with Si. Finally, the addition of $NH_4OH$ may affect particle formation since different pH valves may result in improved particle performance depending on the action of the zeta potential between the particles and the wafer surface.

Example 2
BHF and CFM Technologies FULL-FLOW System

BHF can be made by mixing $NH_4OH$ and HF, since $NH_4OH$ and HF mixed will give $NH_4F$. If an over concentration of HF is used, then one obtains $NH_4F$ and HF. In the CFM Full-Flow™ system, new software was developed to co-inject $NH_4OH$ and HF to obtain BHF. Traditionally in mixtures of $NH_4F$ and HF, ratios of 6:1 or 7:1 ($NH_4F$:HF) are most popular, meaning volume ratios of $NH_4F$ and HF and where $NH_4F$ is delivered in a 40%-w solution and HF is delivered in a 49%-w solutions. However, concentrations as high as 20:1 are also used in the industry. The 6:1 volumetric ratio of $NH_4F$:HF actually corresponds to a molar ratio of 2.65:1. This can be achieved roughly by a volumetric ratio of 1:1 of co-injected $NH_4OH$ and HF if the $NH_4OH$ is delivered in a 29%-w solution and the HF is delivered in a 49%-w solution.

Indeed, in a 1:1 solution, there are 24.5 mole/l HF and 17 mole/l $NH_4OH$. The 17 mole/l $NH_4OH$ together with 17 mole/l HF will form $NH_4F$ and leave 7.5 mole/l HF excess. This gives a molar ratio of 17:7/5=2.3:1 $NH_4F$:HF, close to the molar ratio in a 6:1 solution, which is 2.65:1.

This shows that co-injection of HF and $NH_4OH$ in the CFM Full-Flow™ will require similar volumes of HF and $NH_4OH$ to be injected, which is very advantageous, since now similar hardware can be used to inject both chemicals into the process vessel (reaction chamber).

What is claimed is:

1. A method for treating electronic component precursors with a solution containing ammonium fluoride, comprising the steps of:

(a) providing a source of ammonium hydroxide ($NH_4OH$) and a source of hydrogen fluoride (HF);

(b) transferring an amount of ammonium hydroxide from the source of ammonium hydroxide to a treatment vessel and transferring an amount of hydrogen fluoride from the source of hydrogen fluoride to the treatment vessel to prepare a treatment solution comprising ammonium fluoride ($NH_4F$); and (c) contacting a plurality of electronic component precursors with the treatment solution in the treatment vessel to remove waste material from the electronic component precursors.

2. The method of claim 1 wherein said electronic component precursors are semiconductor wafers.

3. The method of claim 1 wherein said source of ammonium hydroxide is selected from the group consisting of ammonium hydroxide and buffers thereof.

4. The method of claim 1 wherein said source of hydrogen fluoride is selected from the group consisting of hydrogen fluoric acid and buffers thereof.

5. The method of claim 1 wherein said treatment solution further comprises an additive selected from the group consisting of surfactants, complexing agents, or corrosion inhibitors.

6. A method for treating electronic component precursors with a cleaning solution containing ammonium fluoride, comprising the steps of:

(a) providing a source of ammonium hydroxide ($NH_4OH$) and a source of hydrogen fluoride (HF);

(b) transferring an amount of ammonium hydroxide from the source of ammonium hydroxide to a treatment vessel and transferring an amount of hydrogen fluoride from the source of hydrogen fluoride to the treatment vessel to prepare a treatment solution comprising ammonium fluoride ($NH_4F$) and hydrogen fluoride, where the molar concentration of ammonium fluoride is from about 0.02 to about 15 and the molar concentration of hydrogen fluoride is from about 0.01 to about 30 in the treatment solution; and (c) contacting a plurality of electronic component precursors with the treatment solution in the treatment vessel to remove waste material from the electronic component precursors.

7. The method of claim 6 wherein said electronic component precursors are semiconductor wafers.

8. The method of claim 6 wherein said source of ammonium hydroxide is selected from the group consisting of ammonium hydroxide and buffers thereof.

9. The method of claim 6 wherein said source of hydrogen fluoride is selected from the group consisting of hydrogen fluoric acid and buffers thereof.

10. The method of claim 6 wherein said treatment solution further comprises an additive selected from the group consisting of surfactants, complexing agents, or corrosion inhibitors.

* * * * *

UNITED STATES PATENT AND TRADEMARK OFFICE
CERTIFICATE OF CORRECTION

PATENT NO. : 5,972,123　　　　　　　　　　　　　　　　　　　Page 1 of 2
DATED : October 26, 1999
INVENTOR(S) : Verhaverbeke It is certified that error appears in the above-identified patent and that said Letters Patent is hereby corrected as shown below:

Title page,
Item [56] insert the following:
References Cited
U.S. PATENT DOCUMENTS

| | | |
|---|---|---|
| 5,306,400 | 5/3/94 | Chen |
| 5,447,890 | 9/5/95 | Kato et al |
| 4,171,242 | 10/16/79 | Liu |
| 4,545,918 | 10/8/85 | Pralus |
| 4,778,532 | 10/18/88 | McConnell et al |
| 4,795,582 | 01/03/89 | Ohmi et al. |
| 4,917,123 | 04/17/90 | McConnell et al. |

Column 7,
Line 27, please delete "hydrfluroic" and insert -- hydrofluoric -- therefor;
Line 27, please delete "hydrooxiude" and insert -- hydroxide -- therefor;
Line 30, please delete "hydrtoxide" and insert -- hydroxide -- therefor;
Line 29, please delete "tetramethly" and insert -- tetramethyl -- therefor;

Column 9,
Line 4, please delete "[H F]/[NH4F]=([H4F]-[NH4OH])/[NH4OH]" and insert -- [HF]/[NH4F]=[HF]-[NH4OH])/[NH4OH] -- therefor;

Column 10,
Line 17, please delete "ie.," and insert -- i.e., -- therefor;

Column 11 & 12,
Table 1- continued, header row, please delete "1.6" and insert -- 1.8 -- therefor;

UNITED STATES PATENT AND TRADEMARK OFFICE
CERTIFICATE OF CORRECTION

PATENT NO. : 5,972,123
DATED : October 26, 1999
INVENTOR(S) : Verhaverbeke

It is certified that error appears in the above-identified patent and that said Letters Patent is hereby corrected as shown below:

<u>Column 13,</u>
Line 39, please delete "17 mole/I" and insert -- 17 mole/1 -- therefor.

Signed and Sealed this

Twenty-eighth Day of May, 2002

Attest:

*Attesting Officer*

JAMES E. ROGAN
*Director of the United States Patent and Trademark Office*